US011990851B2

United States Patent
Ozturk et al.

(10) Patent No.: US 11,990,851 B2
(45) Date of Patent: May 21, 2024

(54) MANUFACTURING OF A FLEXIBLE PIEZOELECTRIC FILM-BASED POWER SOURCE

(71) Applicant: Morgan State University, Baltimore, MD (US)

(72) Inventors: Birol Ozturk, Parkville, MD (US); Peker Milas, Baltimore, MD (US)

(73) Assignee: Morgan State University, Baltimore, MD (US)

( * ) Notice: Subject to any disclaimer, the term of this patent is extended or adjusted under 35 U.S.C. 154(b) by 446 days.

(21) Appl. No.: 17/216,375

(22) Filed: Mar. 29, 2021

(65) Prior Publication Data

US 2021/0305915 A1 Sep. 30, 2021

Related U.S. Application Data

(60) Provisional application No. 63/000,588, filed on Mar. 27, 2020.

(51) Int. Cl.
*H10N 30/077* (2023.01)
*H02N 2/00* (2006.01)
(Continued)

(52) U.S. Cl.
CPC ................. *H02N 2/22* (2013.01); *H02N 2/18* (2013.01); *H10N 30/057* (2023.02);
(Continued)

(58) Field of Classification Search
CPC .... H10N 30/057; H10N 30/50; H10N 30/079; H10N 30/30; H10N 30/857;
(Continued)

(56) References Cited

U.S. PATENT DOCUMENTS 8,387,452 B2 * 3/2013 Brusarosco ......... B60C 23/0411
73/146.5
10,215,164 B2 * 2/2019 Dabby .................. H10N 30/30
(Continued)

FOREIGN PATENT DOCUMENTS

JP 2017220650 A * 12/2017

OTHER PUBLICATIONS

Namvarrechi et al, "Fabrication and Characterization of Piezoelectric PVDF-TrFE Sensor Fabricated Using Spin Coating Method for Biomedical Device Applications," 2020 International Conference on Biomedical Innovations and Applications (BIA), Varna, Bulgaria, 2020, pp. 33-36. (Year: 2020).*
(Continued)

*Primary Examiner* — A. Dexter Tugbang
(74) *Attorney, Agent, or Firm* — Whiteford, Taylor & Preston, LLP; Peter J. Davis

(57) ABSTRACT

A method for manufacturing a piezoelectric element for generating electricity upon flexing of the element including the steps spin-coating a first substrate layer onto a support substrate; depositing a first electrode film onto the first substrate layer; spin coating polyvinylidene fluoride (PVDF) containing solution on the first electrode film to result in a PVDF film; annealing the PVDF film; depositing a second electrode film onto the PVDF film; spin-coating a second substrate layer on top of the second electrode film; forming a hole through the first and second substrate layers; filling the hole with silver paste to contact to the first and second electrode layers; peeling a resulting substrate/electrode/PVDF/electrode/substrate device from the support substrate; and placing a drop of silver paste in the hole formed in the first substrate layer.

23 Claims, 8 Drawing Sheets

(51) Int. Cl.
  *H02N 2/18* (2006.01)
  *H10N 30/057* (2023.01)
  *H10N 30/098* (2023.01)
  *H10N 30/30* (2023.01)
  *H10N 30/50* (2023.01)
  *H10N 30/857* (2023.01)
  *H10N 30/87* (2023.01)

(52) U.S. Cl.
  CPC ......... *H10N 30/077* (2023.02); *H10N 30/098* (2023.02); *H10N 30/30* (2023.02); *H10N 30/50* (2023.02); *H10N 30/857* (2023.02); *H10N 30/877* (2023.02); *H10N 30/878* (2023.02); *Y10T 29/42* (2015.01)

(58) Field of Classification Search
  CPC .. H10N 30/877; H10N 30/878; H10N 30/077; H10N 30/098; Y10T 29/42; H02N 2/18; H02N 2/22
  See application file for complete search history.

(56) References Cited

U.S. PATENT DOCUMENTS

| | | | |
|---|---|---|---|
| 10,301,150 B2* | 5/2019 | Peng | F16F 7/14 |
| 10,441,185 B2* | 10/2019 | Rogers | A61B 5/4875 |
| 10,553,773 B2* | 2/2020 | Kasichainula | H02S 10/30 |
| 2020/0191646 A1* | 6/2020 | Jin | H10N 30/063 |

OTHER PUBLICATIONS

Zhao et al, "A Shoe-Embedded Piezoelectric Energy Harvester for Wearable Sensors," Sensors, Jul. 11, 2014, pp. 12498-12540.*
Bahk et al, "Flexible Thermoelectric Materials and Device Optimization for Wearable Energy Harvesting," Journal of Materials Chemistry C, Issue 40, Jul. 1, 2015, pp. 10362-10374.*

* cited by examiner

MANUFACTURING OF A FLEXIBLE PIEZOELECTRIC FILM-BASED POWER SOURCE

BACKGROUND OF THE INVENTION

Field of the Invention

The present invention relates to a system that harvests energy through wearable devices using non-toxic materials.

Description of the Background

Polyvinylidene fluoride (PVDF) is a non-reactive, semi-crystalline polymer that displays large piezoelectric and pyroelectric properties; thus, it has been the choice of ferroelectric material in the fabrication of a broad range of multiferroic composite materials.

The four crystal polymorphs of PVDF are referred to as α, β, γ and δ. The β phase of PVDF exhibits all-trans conformation, where hydrogen and fluorine atoms are located on the opposite ends of the polymer chain, causing a net non-zero dipole moment. Thus, β phase exhibits large piezoelectric response and a high dielectric constant.

U.S. Pat. No. 8,387,452 describes a flexible piezoelectric element associated with an energy storage device, but the application is restricted to generation of power from rolling tires. U.S. Pat. No. 10,441,185 refers to a flexible substrate intended to conform with human skin, e.g., for physiological measurement and stimulation. U.S. Pat. No. 10,553,773 discloses a thin film-based system that also is bendable and produces power, generally using any number of metals as part of its structure. U.S. Pat. No. 10,301,150 is directed to energy generated from rolling motions in a shoe, using a variety of other materials. U.S. Pat. No. 10,215,164 relates to electricity-producing fabric or clothing that may be constructed from piezoelectric materials, including PVDF thin films.

Publications that discuss energy harvesting methods via flexible materials include, "A Shoe-Embedded Piezoelectric Energy Harvester for Wearable Sensors," Sensors, Jul. 11, 2014; "Flexible Thin-film Thermoelectric Generator Inserting Cr Buffer Layer," National Institute of Advanced Industrial Science and Technology, Dec. 2, 2012; and "Flexible Thermoelectric Materials and Device Optimization for Wearable Energy Harvesting," Journal of Materials Chemistry C, Issue 40, Jul. 1, 2015.

SUMMARY OF THE INVENTION

The invention is a compact high β phase content PVDF film-based energy harvesting device based on piezoelectric and triboelectric principles. It is a system that generates power through piezoelectric-active layer material, comprised of a flexible substrate such as polypropylene (PP) or polydimethylsiloxane (PDMS) that supports PVDF thin films sandwiched between two electrode sheets such as aluminum or conductive plastic.

The invention is based on the discovery of a procedure for obtaining high β phase content PVDF film deposition through high speed (at about 4,000 rpm to about 12,000 rpm, preferably at about 6,000 rpm to about 10,000 rpm, and most preferably at about 9000 rpm) spin coating on flexible substrates followed by annealing at a range of temperatures from 0° C. to 80° C., preferably about 10° C. to about 50° C., and most preferably at 20° C. FIGS. 2-5 depict results for the identification of β phase content of PVDF films deposited on polypropylene flexible substrates at varying annealing temperatures, weight ratios and the number of steps in reaching the final spin coating speeds. PVDF solutions were prepared in dimethylformamide (DMF) solvent for spin coating. Device fabrication with 20° C. annealing temperature and 20% weight ratio of PVDF in the solvent were shown to produce highest β phase content PVDF. The flexible polypropylene substrates enable energy harvesting through bending when used, for example, as wearable devices.

Accordingly, there is provided according to an embodiment of the invention, a method for manufacturing PVDF film having at least about 90% beta content comprising spin coating a PVDF/solvent onto a substrate at a spin rate of 9000 rpm. According to a preferred embodiment, of the invention, the ratio of PVDF to solvent in the PVDF solvent solution is at least about 20% (w/v). And according to another preferred embodiment of the invention, the PVDF film is annealed at 20° C. following spin coating.

According to another embodiment of the invention, there is provided a method for manufacturing a piezoelectric element for generating electricity upon flexing of the element, including the following steps:

1) Spin-coating a first substrate layer onto a support substrate;
2) Depositing a first electrode film onto the first substrate layer;
3) Spin coating PVDF containing solution on the first electrode film to result in a PVDF film;
4) Annealing the PVDF film;
5) Depositing a second electrode film onto the PVDF film;
6) Spin-coating a second substrate layer on top of the second electrode film;
7) Forming a hole through the first and second substrate layers;
8) Filling the hole with silver paste to contact to the first and second electrode layers.
9) Peeling a resulting substrate/electrode/PVDF/electrode/substrate device from the support substrate;
10) Placing a drop of silver paste in the hole formed in the first substrate layer.

According to a further embodiment of the invention, steps 1)-6) may be repeated at least once before proceeding to step 7), to create a multi-PVDF layer device.

According to a preferred embodiment of the invention, the PVDF solution has a PVDF to solvent ratio of about 20% or greater. According to a further preferred embodiment, the PVDF layer has a beta content of at least about 90%.

According to various embodiments of the invention, spin coating PVDF containing solution is carried out at a spin rate of about 4,000 rpm to about 12,000 rpm, preferably at a spin rate of about 6,000 rpm to about 10,000 rpm, and most preferably at a spin rate of about 9,000 rpm.

According to further embodiments of the invention, annealing of the PVDF film takes place at a temperature of about 0° C. to about 80° C., preferably at a temperature of about 10° C. to about 50° C., and most preferably at a temperature of about 20° C.

According to other embodiments of the invention, the annealed PVDF film has a thickness of about 35 microns to about 60 microns, about 15 microns to about 35 microns, or about 7 microns to about 15 microns, and preferably about 10 microns.

According to still other embodiments of the invention, the first and second substrate layers may be polypropylene, polydimethylsiloxane, teflon, nylon, acetate, rubber or elastomers, having a thickness of about 100 microns to about 5 nanometers, preferably less than 1 nanometer, and most preferably about 300 microns.

According to still further embodiments of the invention, the electrodes may be made of aluminum or copper (having a thickness of about 100 nanometers to about 300 nanometer, about 150 nanometers to about 250 nanometers, and preferably about 200 nanometers), conductive plastic (for example, poly(3,4-ethylenedioxythiophene) polystyrene sulfonate having a thickness of about 1 micron to about 100 microns, about 40 microns to about 60 microns, and preferably about 50 microns) or conductive rubber.

According to another embodiment of the invention, there is provided a piezoelectric element configured to generating electricity upon flexing, the piezoelectric element having:
1) a first substrate layer;
2) a first electrode film on the first substrate layer;
3) a PVDF film;
4) a second electrode film on a side of the PVDF film opposite said first electrode film;
5) a second substrate layer on top of the second electrode film;
6) said first and second substrate layers and said first and second electrode films defining a continuous through-bore containing conductive material conductively connecting said first and second substrate layers and said first and second electrode films, wherein each of the above elements may be manufactured according to any of the steps and materials described above and herein.

According to a further embodiment of the invention, there is provided a method for manufacturing a freestanding piezoelectric PVDF thin film, the method including depositing PVDF containing solvent onto a substrate by pipette, substantially covering the surface of the substrate, evaporating the solvent, peeling a dried PVDF film from the substrate to produce said freestanding piezoelectric PVDF free standing film. According to a still further embodiment, the freestanding piezoelectric PVDF film may be sandwiched between a pair of metallic foil or conductive plastic electrodes.

DETAILED DESCRIPTION

Development of novel lightweight power sources has critical importance due to increasing weight burdens, including for soldiers who carry heavy battery packs, as an example. Piezoelectric energy harvesters placed in soldier boots were successfully demonstrated in producing enough power to charge batteries while walking. Flexible polymeric piezo films have the potential to significantly increase the energy harvesting efficiency through their use in wearable devices. PVDF is a commonly used polymer piezoelectric material. Among its four distinct phases, β-phase is the only one that exhibits a spontaneous polarization, and thus piezoelectricity.

Figure 6A:
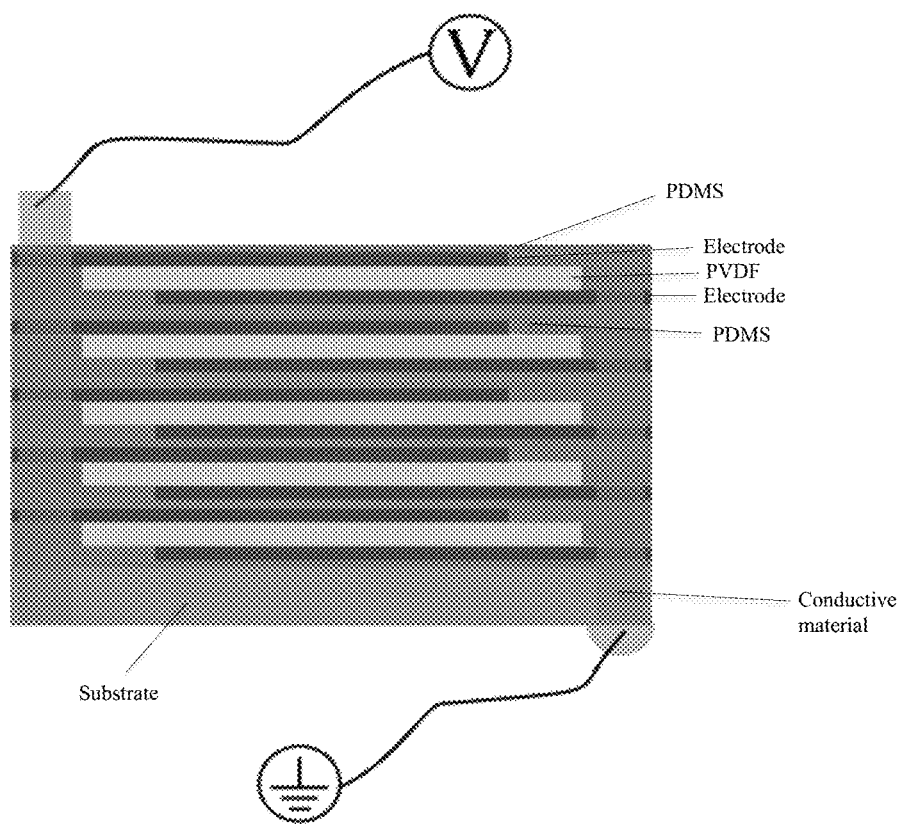
FIG. 6A is a diagram of multilayer devices connected in parallel configuration.
Figure 6B:
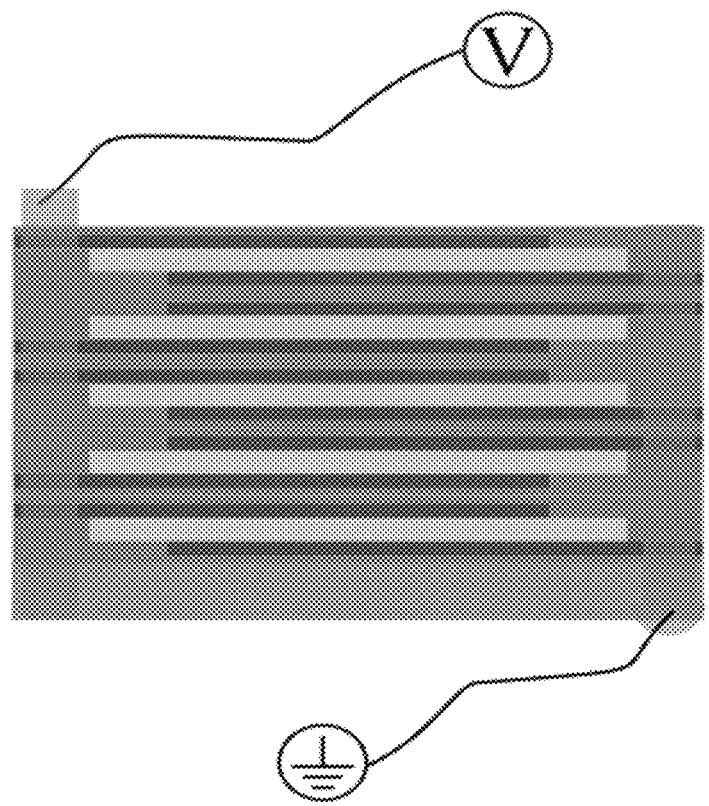
FIG. 6B is a diagram of multilayer devices connected serial configuration.

A compact system is presented here for optimizing energy harvesting efficiency using of very thin (less than 10 μm thickness) PVDF films. The system is comprised of a flexible substrate such as polypropylene (PP) or Polydimethylsiloxane (PDMS) that supports PVDF thin films sandwiched between electrode sheets. The flexible substrates may be also made from Teflon, nylon, acetate, rubber and elastomers. The thickness of the substrate may be about 100 microns to about 5 mm, is preferably below 1 mm, and is most preferably about 300 microns. The electrode sheets may be metal film or conductive plastic film. Examples of metal films suitable for use with the invention include aluminum and copper. The thickness of metal thin films may be about 100 nm to about 300 nm, is preferably about 150 to about 250 nm and is most preferably about 200 nm. Examples of conductive plastic suitable for use with the invention include poly(3,4-ethylenedioxythiophene) polystyrene sulfonate (PEDOT:PSS). Conductive rubber may also be used. The thickness of the polymer electrode sheets may be about 1 micron to about 100 microns, is preferably about 40 to about 60 microns and is most preferably about 50 microns. The PVDF films may be fabricated at different selected thicknesses by increasing spin rates. The most preferred thickness of the PVDF film is about 10 microns, although embodiments of the invention include PVDF thicknesses of about 7 microns to about 12 microns, about 15 microns to about 30 microns, and about 35 to about 60 microns. The PVDF films may also be fabricated in various different stacking arrangements in order to further allow the electrode to more efficiently produce energy. As an example, the PVDF films may be fabricated to operate in parallel or in series by using different stacking arrangements as shown in FIGS. 6A and 6B, respectively.

The device of the invention may have single layer or multiple PVDF layers, with each additional layer producing additional energy upon flexing/bending. According to a preferred embodiment, the process of the invention requires preparing the PVDF layer at a high spin rate of 9000 rpm, which makes it more difficult to fabricate the device, but the inventors discovered that the resulting device is a more efficient power source. In addition, the stacking of multiple PVDF layers reduces shear and allows for the electrode to more efficiently collect energy.

Example

Figure 1:
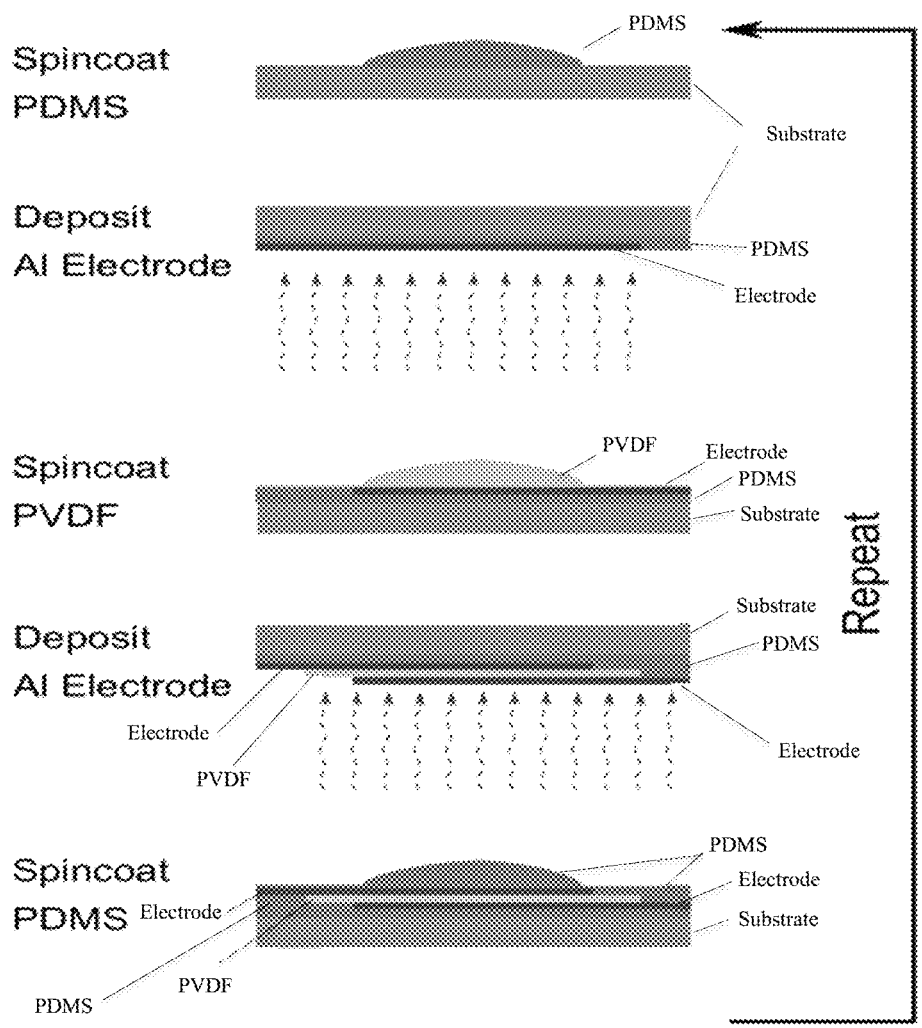
FIG. 1 shows steps of device preparation with direct electrode deposition and spin coated PVDF thin films according to an embodiment of the invention.

Referring to FIG. 1, the preferred fabrication process for direct electrode deposition on spin coated PVDF thin film layer is as follows:

1) The powder form of PVDF is turned into a solvent form for obtaining thin films. For this purpose, a half and half mixture of dimethylformamide (DMF) and acetone is prepared. $Mg(NO_3)_2$ is added into the mixture at 0.2% (w/v) and stirred for 30 minutes at room temperature. PVDF powder is dissolved in this mixture to get a 20% (w/v) solution by constantly stirring at 45° C. for 2 hours.
2) Spin-coating a glass slide support substrate with a first layer of PDMS with 200 microliter of its solution at 1000 rpm for 30 seconds to achieve a thickness of 300 microns.
3) Deposit a first 200 nm thick Aluminum (Al) electrode film onto the PDMS film using thermal evaporation.
4) 30 microliter PVDF containing solution is spin-coated on Al film at room temperature and 9000 rpm for one minute to achieve a thickness of 10 micron.
5) The deposited PVDF film is annealed at 20° C. on a hotplate for 4 hours.
6) Deposit a second 200 nm thick Al electrode film onto the PVDF film.
7) Spin-coating a second PDMS layer with 200 microliter of its solution on top of the second electrode by spin-coating at 1000 rpm for 30 seconds to achieve a thickness of 300 microns.
8) Repeat steps 2-7 for multi-PVDF layer devices.
9) A hole is formed on the PDMS layer with a 14-gauge needle.
10) The hole is filled with silver paste for assuring contact to the aluminum electrode layers.
11) PDMS/Aluminum/PVDF/Aluminum/PDMS device of 1–N layers is peeled off from the glass substrate.
12) Top layer contact is formed by a drop of silver paste placed in a hole formed on the top PDMS layer.
13) Alternatively, steps 9-12 may take place after step 7 and repeated together with steps 2-7 for each layer.
14) Wires are attached for energy harvesting during bending experiments.

While the foregoing example sets forth the most preferred embodiment of the invention, the same steps may be carried out according to other embodiments of the invention, including, but not limited to, variations to one or more of: PVDF content in the solvent, composition and thickness of PDMS layers, composition and thickness of electrodes, spin rate and annealing temperature of the PVDF layer; and whether or not the layering process is repeated, and if so, how many times the layering process is repeated.

Figure 2:
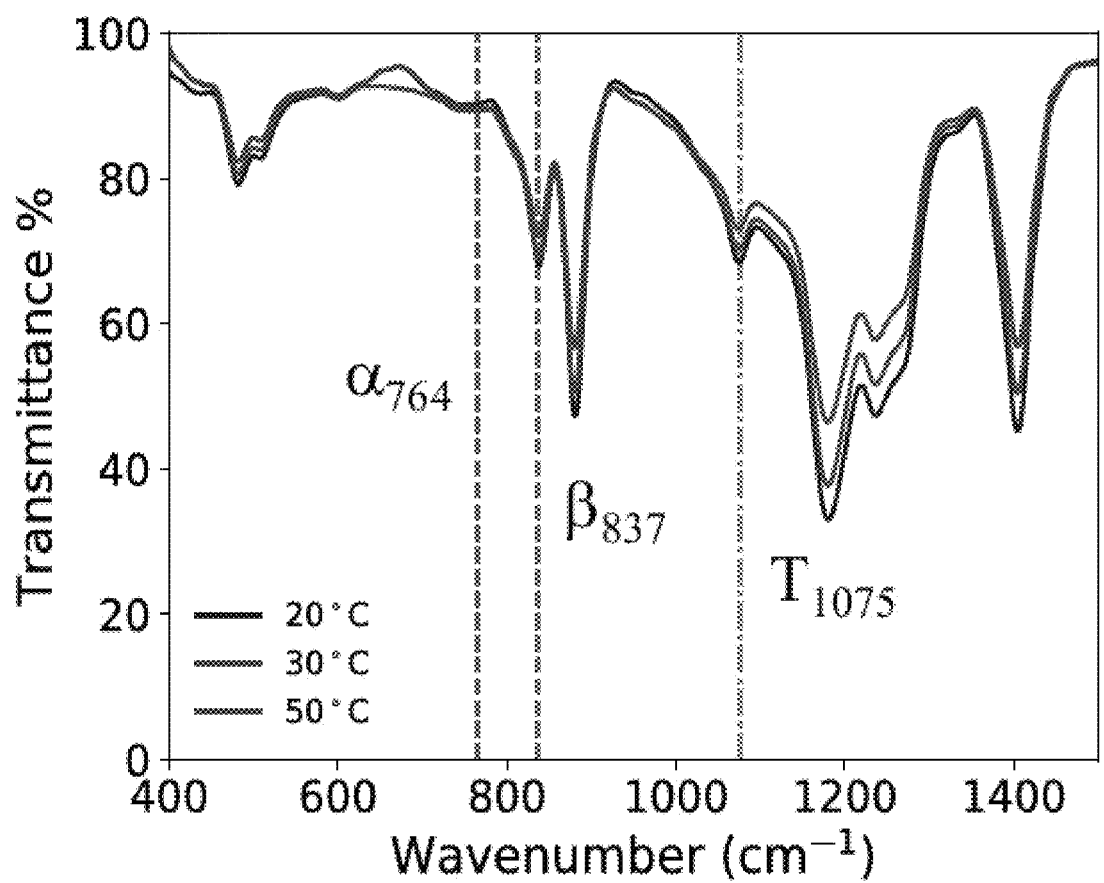
FIG. 2 shows a Fourier transform infrared spectroscopy (FTIR) data showing the change in β-phase content as a function of annealing temperature of PVDF films.
Figure 3:
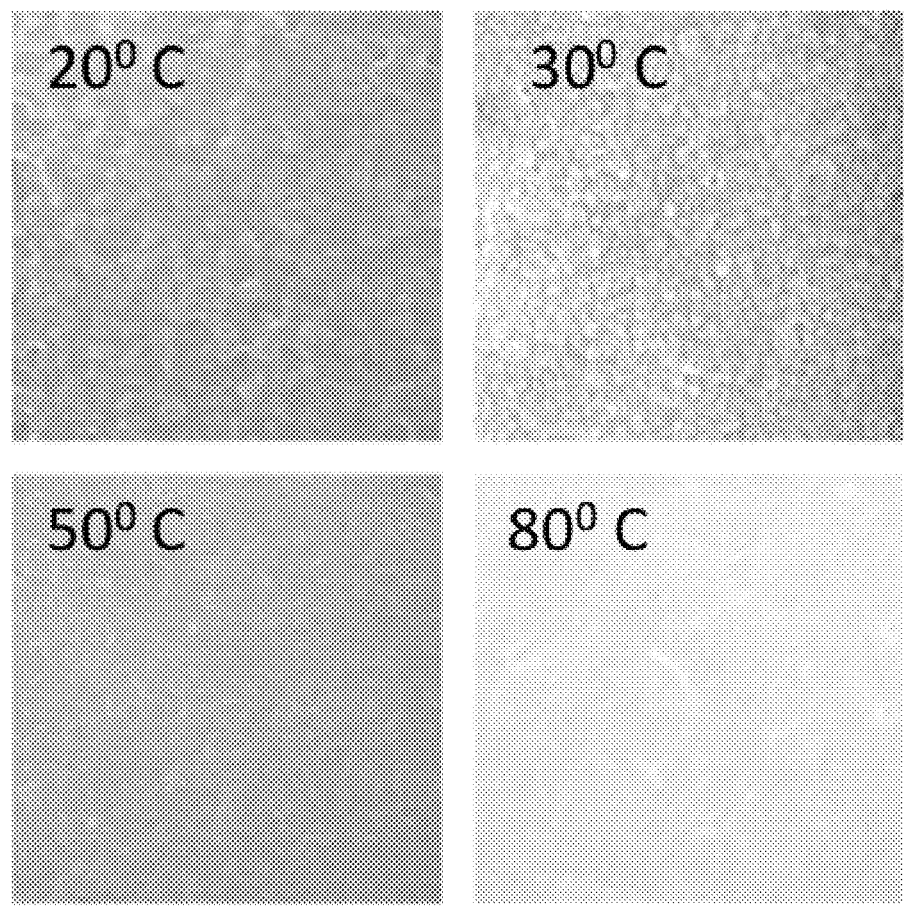
FIG. 3 shows scanning electron microscopy (SEM) images of samples annealed at various temperatures indicating reduction in the surface roughness of PVDF thin films with increased annealing temperature.
Figure 4:
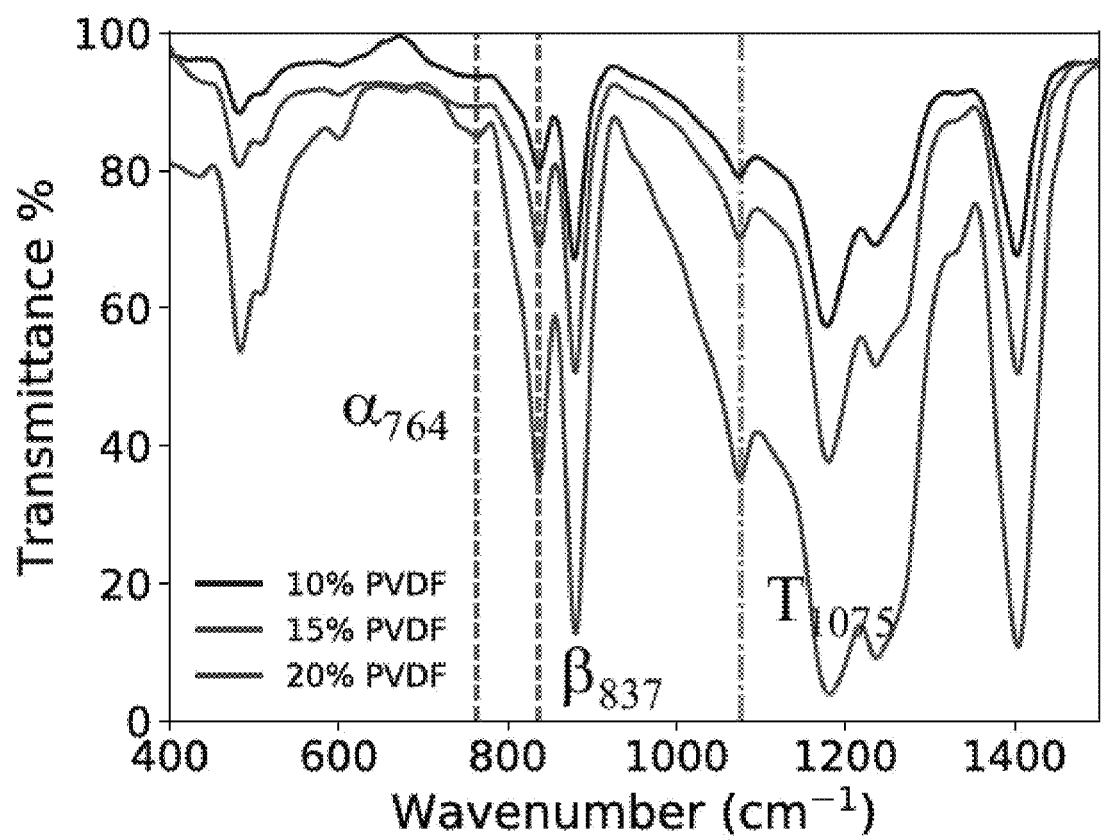
FIG. 4 shows FTIR data showing the change in β-phase content as a function of PVDF weight ratio in the solvent, dimethylformamide (DMF).
Figure 5:
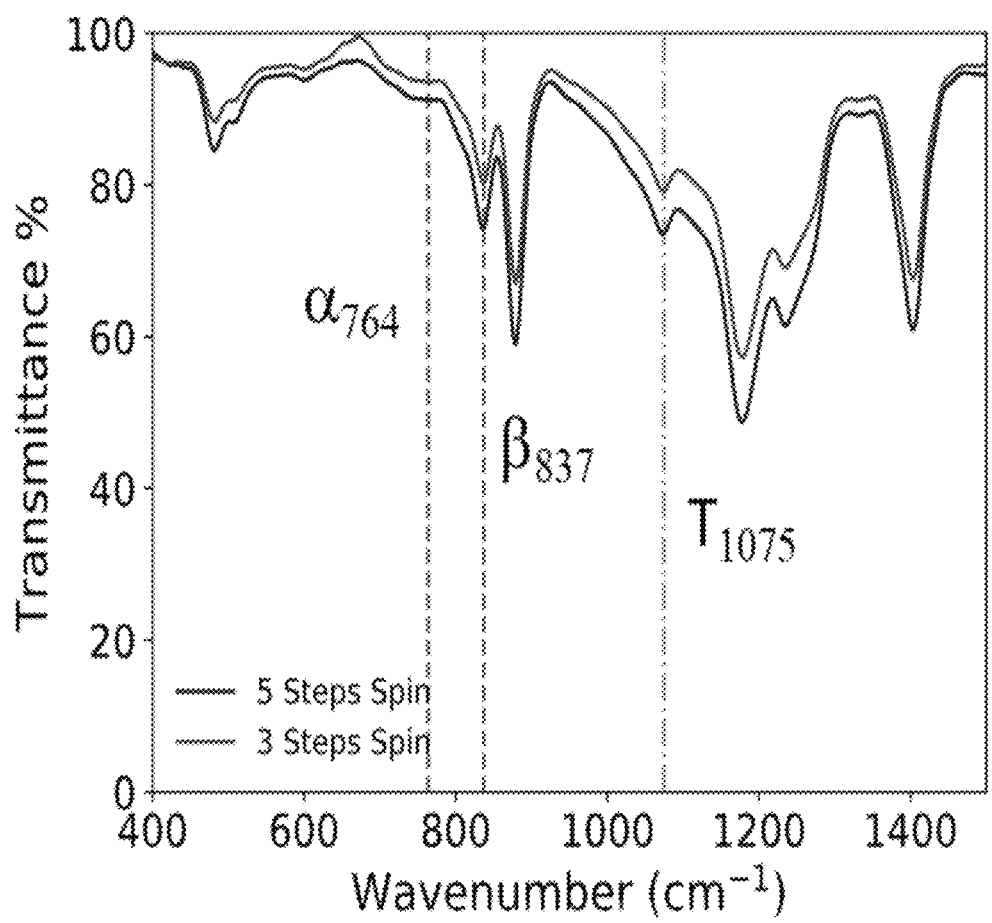
FIG. 5 shows FTIR spectroscopy of PVDF thin films deposited at different numbers of steps showing the relative amount of different phases according to an embodiment of the invention.

Characterization of PVDF films for β-content was carried out through the following methods:
1) Fourier-transform infrared (FTIR) spectroscopy data as a function of annealing temperature. FIG. 2 shows that as annealing temperature increases, β-phase content increases.
2) Scanning electron microscopy images of samples annealed at various temperatures. FIG. 3 shows that the roughness of the PVDF layer decreases with increased annealing temperature.
3) FTIR data showing the change in β-phase content as a function of PVDF weight ratio in solvent dimethylformamide (DMF). FIG. 4 shows that the β-phase content increases substantially as the PVDF weight ratio in the solvent increases.
4) FTIR data relative to spin rate. FIG. 5 shows that the β-phase content increases the spin rate increases (spin rate is increased with each additional spin step).

The resultant characterized beta content from PVDF film made according to the present invention is about 90%, where the PVDF weight ratio to solvent is 20%, the PVDF spin-coat rate is 9000 rpm to a thickness of 100 microns, and the PVDF layer annealing is carried out at 80° C. This compares favorably to the 70% beta content in prior art PVDF films of the same thickness.

The voltage pulses from the fabricated devices in the compression tests were converted into DC voltage signals with a full wave rectifier circuit and a capacitor. Capacitor values were chosen to obtain large enough time constants (time constant=Internal resistance of the device×Capacitance) specific to the compression frequency. For example, the average frequency for walking is 2 Hz and the expected duration between voltage pulses is 0.5 second. Thus, a time constant less than 0.1 seconds will suffice efficient DC conversion without ripple formation. DC voltages up to 2 volts were obtained from single layer devices and over 3 volts DC signals were harvested from multilayer devices, which are enough for charging batteries.

Figure 7:
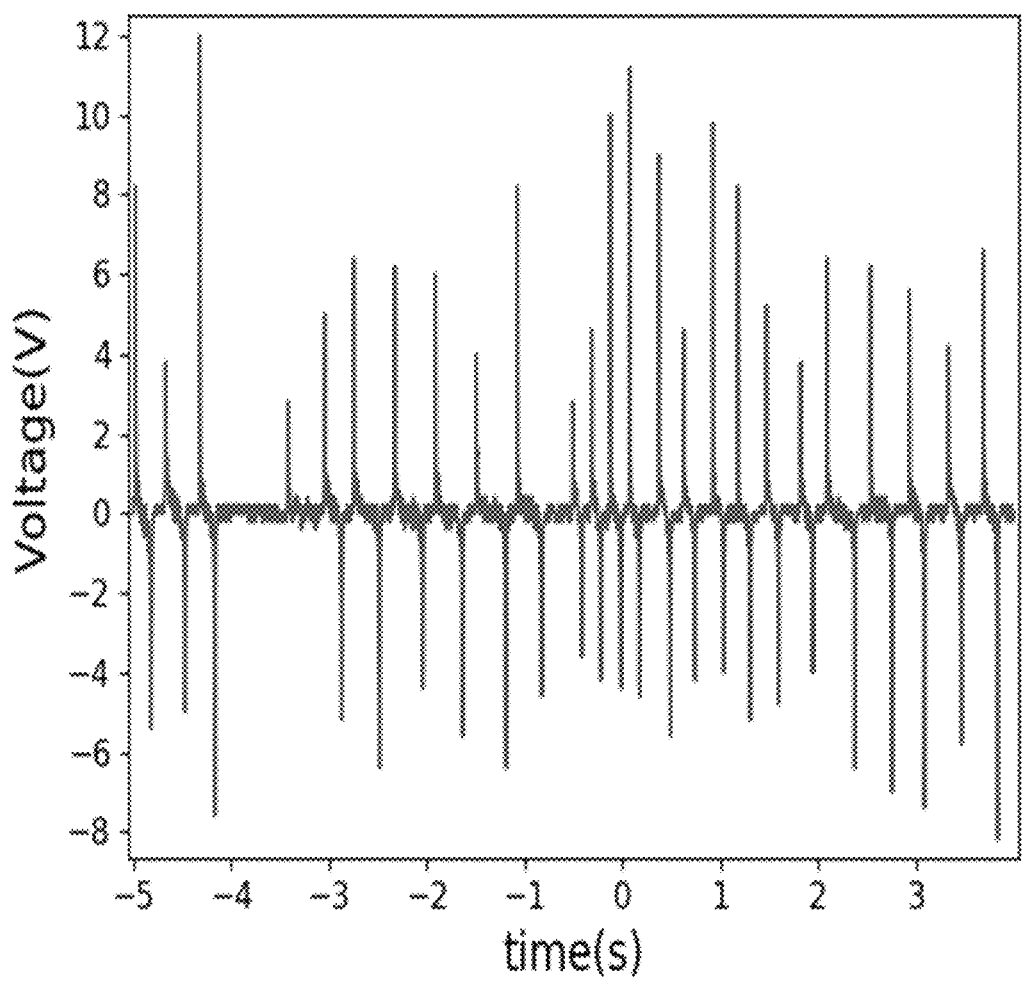
FIG. 7 shows voltage pulses generated in the compression test of a single layer device.

According to an alternative embodiment of the invention, freestanding PVDF thin films may be prepared with thin metallic foils and conductive plastic electrodes, by depositing PVDF containing solvent onto a substrate by pipette, substantially or entirely covering the surface of the substrate, followed by evaporation of the solvent by heating at 120° C. for two hours. The dried PVDF film may then be peeled off from the substrate to obtain free standing films, which can be sandwiched between a pair of thin metallic foil or conductive plastic electrodes for device fabrication. Voltage pulses up to 12 volts were observed in the compression tests of these devices, see FIG. 7

The thickness of single layer PVDF devices can be less than 200 microns, enabling the fabrication of multilayer devices that can fit into shoe soles, which will work in the compression mode. These wearable devices can be used to charge standard size batteries (AA, AAA, etc.) for military applications, or to charge Lithium Polymer (LIPO) batteries which can be used in power bank style smartphone cases, or to power LEDs for kids' shoes. Larger scale devices will enable energy harvesting in ground, air or sea vehicles from mechanical motion, which is critical for the fast-growing electric vehicle industry.

While the examples above are described with reference to various implementations and exploitations, it will be understood that these examples are illustrative and that they are not intended to limit scope of the inventive subject matter. The claim terms are intended to be attributed their ordinary meaning to persons of ordinary skill in the art, and no disclosure herein in intended to narrow the scope of the claims relative to their broadest reasonable interpretation.

The invention claimed is:
1. A method for manufacturing a piezoelectric element for generating electricity upon flexing of the element, comprising:
  a. spin-coating a first substrate layer onto a support substrate;
  b. depositing a first electrode film onto the first substrate layer;
  c. spin coating polyvinylidene fluoride (PVDF) containing solution on the first electrode film to result in a PVDF film;
  d. annealing the PVDF film;
  e. depositing a second electrode film onto the PVDF film;
  f. spin-coating a second substrate layer on top of the second electrode film;
  g. forming a hole through the first and second substrate layers;

h. filling the hole with silver paste to contact to the first and second electrode layers;
i. peeling the support substrate from the first substrate layer resulting in a multilayer device;
j. placing a drop of silver paste in the hole formed in the first substrate layer.

2. The method of claim 1, further comprising repeating steps a-f at least once before proceeding to step g, to create a multi-PVDF layer device.

3. The method of claim 1, wherein the PVDF containing solution has a PVDF to solvent ratio of 20%.

4. The method of claim 1, wherein the spin-coating of the PVDF containing solution is carried out at a spin rate of about 4,000 rpm to about 12,000 rpm.

5. The method of claim 1, wherein the spin-coating of the PVDF containing solution is carried out at a spin rate of about 6,000 rpm to about 10,000 rpm.

6. The method of claim 1, wherein the spin-coating of the PVDF containing solution is carried out at a spin rate of about 9,000 rpm.

7. The method of claim 1, wherein annealing the PVDF film takes place at a temperature of about 0° C. to about 80° C.

8. The method of claim 1, wherein annealing the PVDF film takes place at a temperature of about 10° C. to about 50° C.

9. The method of claim 1, wherein annealing the PVDF film takes place at a temperature of about 20° C.

10. The method of claim 1, wherein the annealed PVDF film has a thickness of about 35 microns to about 60 microns.

11. The method of claim 1, wherein the annealed PVDF film has a thickness of about 15 microns to about 35 microns.

12. The method of claim 1, wherein the annealed PVDF film has a thickness of about 10 microns.

13. The method of claim 1, wherein the first and second substrate layers may comprise of polypropylene, polydimethylsiloxane, Teflon, nylon, acetate, rubber or elastomers.

14. The method of claim 1, wherein the first and second substrate layers may have a thickness of about 100 microns to about 5 nanometers.

15. The method of claim 1, wherein the first and second substrate layers may have a thickness of less than 1 nanometer.

16. The method of claim 1, wherein the first and second substrate layers may have a thickness of about 300 microns.

17. The method of claim 1, wherein the electrodes may be made of aluminum, copper, conductive plastic or conductive rubber.

18. The method of claim 17, wherein the electrodes may be made of aluminum or copper, and the thickness of the electrodes is from about 100 nanometers to about 300 nanometers.

19. The method of claim 18, wherein the electrodes have a thickness of about 150 nanometers to about 250 nanometers.

20. The method of claim 19, wherein the electrodes have a thickness of about 200 nanometers.

21. The method of claim 17, wherein the electrodes may be poly(3,4-ethylenedioxythiophene) polystyrene sulfonate having a thickness of about 1 micron to about 100 microns.

22. The method of claim 21, wherein the electrodes may have a thickness of about 40 microns to about 60 microns.

23. The method of claim 22, wherein the electrodes may have a thickness of about 50 microns.

* * * * *